United States Patent
Tarsa et al.

(10) Patent No.: US 8,931,929 B2
(45) Date of Patent: Jan. 13, 2015

(54) LIGHT EMITTING DIODE PRIMARY OPTIC FOR BEAM SHAPING

(75) Inventors: Eric Tarsa, Goleta, CA (US); Monica Hansen, Santa Barbara, CA (US); Bernd Keller, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 181 days.

(21) Appl. No.: 13/544,662

(22) Filed: Jul. 9, 2012

(65) Prior Publication Data

US 2014/0009932 A1    Jan. 9, 2014

(51) Int. Cl.
*F21V 3/00* (2006.01)

(52) U.S. Cl.
USPC ................. 362/311.02; 362/235

(58) Field of Classification Search
USPC .............. 362/311.01, 311.02, 311, 311.09
See application file for complete search history.

(56) References Cited

U.S. PATENT DOCUMENTS

| | | | |
|---|---|---|---|
| D85,382 S | 10/1931 | Guth | D26/24 |
| 5,025,356 A | 6/1991 | Gawad | 362/221 |
| 5,823,663 A | 10/1998 | Bell et al. | 362/362 |
| D407,473 S | 3/1999 | Wimbock | D23/328 |
| 6,155,699 A | 12/2000 | Miller et al. | 362/293 |
| 6,210,025 B1 | 4/2001 | Schmidt et al. | 362/362 |
| 6,234,643 B1 | 5/2001 | Lichon, Jr. | 362/147 |
| 6,443,598 B1 | 9/2002 | Morgan | 362/342 |
| 6,523,974 B2 | 2/2003 | Engel | 362/224 |
| D496,121 S | 9/2004 | Santoro | D26/74 |
| 6,871,983 B2 | 3/2005 | Jacob et al. | 362/364 |
| 6,948,840 B2 | 9/2005 | Grenda et al. | 362/555 |
| 7,021,797 B2 * | 4/2006 | Miñano et al. | 362/355 |
| 7,049,761 B2 | 5/2006 | Timmermans et al. | 315/246 |
| 7,213,940 B1 | 5/2007 | Van de Ven et al. | 362/231 |
| 7,237,924 B2 * | 7/2007 | Martineau et al. | 362/231 |
| D556,358 S | 11/2007 | Santoro | D26/74 |
| 7,338,182 B1 | 3/2008 | Hastings et al. | 362/150 |
| 7,510,299 B2 | 3/2009 | Timmermans et al. | 362/225 |
| 7,520,636 B2 | 4/2009 | Van der Poel | 362/290 |
| D593,246 S | 5/2009 | Fowler et al. | D26/76 |
| 7,594,736 B1 | 9/2009 | Kassay et al. | 362/223 |

(Continued)

FOREIGN PATENT DOCUMENTS

| | | |
|---|---|---|
| CN | 101188261 | 5/2008 |
| CN | 202580962 | 12/2012 |

(Continued)

OTHER PUBLICATIONS

International Search Report and Written Opinion from PCT/US2013/049225, dated Oct. 24, 2013.

(Continued)

*Primary Examiner* — Ali Alavi
(74) *Attorney, Agent, or Firm* — Koppel, Patrick, Heybl & Philpott

(57) ABSTRACT

LED components are described having primary optics provide improved LED component emission characteristics. Light fixtures are also described that utilize the LED components to provide improved light fixture emissions. One LED component according to the present invention comprises an LED chip emitting an LED chip emission pattern. A primary optic is included directly on the LED chip with LED light from the LED chip passing through the primary optic. The primary optic shapes the LED emission pattern into an LED component emission pattern with the LED component emission pattern being broader than the LED chip emission pattern.

45 Claims, 8 Drawing Sheets

(56) References Cited

U.S. PATENT DOCUMENTS

| | | | |
|---|---|---|---|
| D604,446 S | 11/2009 | Fowler et al. | D26/76 |
| 7,618,157 B1 | 11/2009 | Galvez et al. | 362/294 |
| 7,618,160 B2 * | 11/2009 | Chinniah et al. | 362/326 |
| D608,932 S | 1/2010 | Castelli | D26/76 |
| 7,654,702 B1 | 2/2010 | Ding et al. | 362/294 |
| 7,661,844 B2 | 2/2010 | Sekiguchi et al. | 362/249 |
| D611,183 S | 3/2010 | Duarte | D26/76 |
| 7,674,005 B2 | 3/2010 | Chung et al. | 362/223 |
| 7,686,484 B2 | 3/2010 | Heiking et al. | 362/375 |
| 7,712,918 B2 | 5/2010 | Siemiet et al. | 362/241 |
| 7,722,220 B2 | 5/2010 | Van De Ven | 362/294 |
| D617,487 S | 6/2010 | Fowler et al. | D26/76 |
| 7,768,192 B2 | 8/2010 | Van de Ven et al. | 313/503 |
| 7,815,338 B2 | 10/2010 | Siemiet et al. | 362/218 |
| 7,828,468 B2 | 11/2010 | Mayfield et al. | 362/342 |
| D633,247 S | 2/2011 | Kong et al. | D26/88 |
| 7,988,321 B2 | 8/2011 | Wung et al. | 362/218 |
| 7,988,335 B2 | 8/2011 | Liu et al. | 362/294 |
| 7,997,762 B2 | 8/2011 | Wang et al. | 362/249 |
| 8,070,326 B2 * | 12/2011 | Lee | 362/307 |
| D653,376 S | 1/2012 | Kong et al. | D26/76 |
| 8,092,049 B2 | 1/2012 | Kinnune et al. | 362/294 |
| 8,162,504 B2 | 4/2012 | Zhang et al. | 362/217 |
| 8,186,855 B2 | 5/2012 | Wassel et al. | 362/373 |
| 8,201,968 B2 | 6/2012 | Maxik et al. | |
| 8,215,799 B2 | 7/2012 | Vanden Eynden et al. | 362/294 |
| 8,256,927 B2 | 9/2012 | Hu et al. | 362/294 |
| 8,317,354 B2 | 11/2012 | Gassner et al. | 362/147 |
| 8,480,252 B2 | 7/2013 | Bertram et al. | 362/243 |
| 8,506,135 B1 | 8/2013 | Oster | 362/373 |
| 8,591,071 B2 | 11/2013 | Hochstein | 362/294 |
| 2004/0001344 A1 | 1/2004 | Hecht | |
| 2005/0264716 A1 | 12/2005 | Kim et al. | |
| 2006/0262521 A1 | 11/2006 | Piepgras et al. | 362/149 |
| 2007/0109779 A1 | 5/2007 | Sekiguchi et al. | |
| 2007/0211457 A1 | 9/2007 | Mayfield et al. | 362/223 |
| 2007/0253205 A1 | 11/2007 | Welker | 362/373 |
| 2007/0297181 A1 | 12/2007 | Mayfield et al. | 362/342 |
| 2008/0049422 A1 | 2/2008 | Trenchard et al. | 362/238 |
| 2008/0232093 A1 | 9/2008 | Kim | |
| 2008/0278943 A1 | 11/2008 | Van der Poel | 362/240 |
| 2009/0196024 A1 | 8/2009 | Heiking et al. | 362/150 |
| 2009/0237958 A1 | 9/2009 | Kim | |
| 2009/0262543 A1 | 10/2009 | Ho | 362/373 |
| 2009/0310354 A1 | 12/2009 | Zampini et al. | 362/235 |
| 2010/0097794 A1 | 4/2010 | Teng et al. | 362/231 |
| 2010/0110679 A1 | 5/2010 | Teng et al. | |
| 2010/0172133 A1 | 7/2010 | Lie | 362/235 |
| 2010/0188609 A1 | 7/2010 | Matsuki et al. | |
| 2010/0254128 A1 | 10/2010 | Pickard et al. | |
| 2010/0254145 A1 | 10/2010 | Yamaguchi | |
| 2010/0254146 A1 | 10/2010 | McCanless | |
| 2010/0295468 A1 | 11/2010 | Pedersen et al. | 315/294 |
| 2011/0032714 A1 | 2/2011 | Chang | 362/373 |
| 2011/0090671 A1 | 4/2011 | Bertram et al. | 362/84 |
| 2011/0141722 A1 | 6/2011 | Acampora et al. | 362/218 |
| 2011/0141734 A1 | 6/2011 | Li et al. | 362/235 |
| 2011/0156584 A1 | 6/2011 | Kim | |
| 2011/0199005 A1 | 8/2011 | Bretschneider et al. | |
| 2011/0199769 A1 | 8/2011 | Bretschneider et al. | |
| 2011/0267810 A1 | 11/2011 | Higman et al. | 362/218 |
| 2012/0038289 A1 | 2/2012 | Jee et al. | |
| 2012/0051041 A1 | 3/2012 | Edmond et al. | |
| 2012/0127714 A1 | 5/2012 | Rehn | |
| 2012/0140461 A1 | 6/2012 | Pickard | |

FOREIGN PATENT DOCUMENTS

| | | |
|---|---|---|
| DE | 102007030186 | 1/2009 |
| DE | 202010001832 | 7/2010 |
| EP | 1298383 A2 | 4/2003 |
| EP | 1357335 A2 | 10/2003 |
| EP | 1653254 | 3/2006 |
| EP | 1737051 | 12/2006 |
| EP | 1847762 A2 | 10/2007 |
| EP | 1860467 | 11/2007 |
| JP | 2002244027 | 11/2002 |
| JP | U3097327 | 8/2003 |
| JP | 2004140327 | 5/2004 |
| JP | 2009295577 | 12/2009 |
| JP | 2010103687 | 5/2010 |
| JP | 2011018471 | 8/2011 |
| JP | 2011018572 | 8/2011 |
| WO | WO 03102467 | 12/2003 |
| WO | WO 2009140761 A1 | 11/2009 |
| WO | WO 2009157999 A1 | 12/2009 |
| WO | WO2010042216 | 4/2010 |
| WO | WO 2010042216 A2 | 4/2010 |
| WO | WO 2011074424 A1 | 6/2011 |
| WO | WO 2011096098 A1 | 8/2011 |
| WO | WO 2011098191 | 8/2011 |
| WO | WO 2011118991 A2 | 9/2011 |
| WO | WO 2011140353 A2 | 11/2011 |

OTHER PUBLICATIONS

Final Rejection issued in Korean Design Appl. No. 30-2011-0038114, dated Jun. 14, 2013.
Final Rejection issued in Korean Design Appl. No. 30-2011-0038115, dated Jun. 14, 2013.
Final Rejection issued in Korean Design Appl. No. 30-2011-0038116, dated Jun. 17, 2013.
International Search Report and Written Opinion from PCT Patent Appl. No. PCT/US2013/035668, dated Jul. 12, 2013.
Notice to Submit a Response from Korean Patent Application No. 30-2011-0038115, dated Dec. 12, 2012.
Notice to Submit a Response from Korean Patent Application No. 30-2011-0038116, dated Dec. 12, 2012.
Office Action from U.S. Appl. No. 13/464,745, dated Feb. 12, 2014.
Office Action from U.S. Appl. No. 13/453,924, dated Feb. 19, 2014.
Office Action from U.S. Appl. No. 13/341,741, dated Jan. 14, 2014.
Office Action from U.S. Appl. No. 13/370,252, dated Dec. 20, 2013.
International Search Report and Written Opinion for Patent Application No. PCT/US2011/001517, dated: Feb. 27, 2012.
U.S. Appl. No. 12/418,796, filed Apr. 6, 2009.
U.S. Appl. No. 13/429,080, filed Mar. 23, 2012.
U.S. Appl. No. 13/028,946, filed Feb. 16, 2011.
U.S. Appl. No. 13/306,589, filed Nov. 29, 2011.
Office Action from Japanese Design Patent Application No. 2011-18570.
Reason for Rejection from Japanese Design Patent Application No. 2011-18571.
Reason for Rejection from Japanese Design Patent Application No. 2011-18572.
US Publication No. US 2007/0115671, date: May 24, 2007 to Roberts et al.
US Publication No. US 2007/0115670, date: May 24, 2007 to Roberts et al.
US Publication No. US 2009/0323334, date: Dec. 31, 2009 to Roberts et al.
US Publication No. US 2009/0225543, date: Mar. 5, 2008 to Roberts et al.
U.S. Appl. No. 12/873,303, filed Aug. 31, 2010 to Edmond, et al.
U.S. Appl. No. 12/961,385, filed Dec. 6, 2010 to Pickard, et al.
Cree's XLamp XP-E LED's, data sheet, pp. 1-16.
Cree's XLamp XP-G LED's, data sheet, pp. 1-12.
International Search Report and Written Opinion for PCT Application No. PCT/US2011/062396, dated Jul. 13, 2012.
Office Action from U.S. Appl. No. 29/387,171, dated May 2, 2012.
Response to OA from U.S. Appl. No. 29/387,171, filed Aug. 2, 2012.
Office Action from U.S. Appl. No. 12/961,385, dated Apr. 26, 2013.
Response to OA from U.S. Appl. No. 12/961,385, filed Jul. 24, 2013.
Office Action from U.S. Appl. No. 13/464,745, dated Jul. 16, 2013.
Office Action from U.S. Appl. No. 29/368,970, dated Jun. 19, 2012.
Office Action from U.S. Appl. No. 29/368,970, dated Aug. 24, 2012.
Response to OA from U.S. Appl. No. 29/368,970, filed Nov. 26, 2012.

(56) References Cited

OTHER PUBLICATIONS

International Search Report and Written Opinion from PCT Application No. PCT/US2013/021053, dated Apr. 17, 2013.
Search Report and Written Opinion from PCT Patent Appl. No. PCT/US2012/047089, dated Feb. 27, 2013.
Search Report and Written Opinion from PCT Patent Appl. No. PCT/US2012/071800, dated Mar. 25, 2013.
International Search Report and Written Opinion from Appl. No. PCT/CN2013/072772, dated Dec. 19, 2013.
Preliminary Report and Written Opinion from PCT appl. No. PCT/US2012/047084, dated Feb. 6, 2014.
Reasons for Rejection from Japanese Patent Appl. No. 2013-543207, dated May 20, 2014.
First Office Action from Chinese Patent Appl. No. 2011800529984, dated May 4, 2014.
Office Action from U.S. Appl. No. 13/844,431, dated May 15, 2014.
Office Action from U.S. Appl. No. 13/341,741, dated Jun. 6, 2014.
International Preliminary Report on Patentabiliby from PCT/US2012/071800 dated Jul. 10, 2014.
Office Action from U.S. Appl. No. 13/189,535, dated Jun. 20, 2014.
Office Action from U.S. Appl. No. 13/453,924, dated Jun. 25, 2014.
Office Action from U.S. Appl. No. 13/443.630, dated Jul. 1, 2014.
Office Action from U.S. Appl. No. 13/464.745. dated Jul. 16, 2014.
International Preliminary Report on Patentability and Written Opinion from PCT/US2013/021053, dated Aug. 21, 2014.
Communication from European Patent Appl. No. 13701525.1-1757. dated Sep. 26. 2014.

\* cited by examiner

Intensity Slice Data

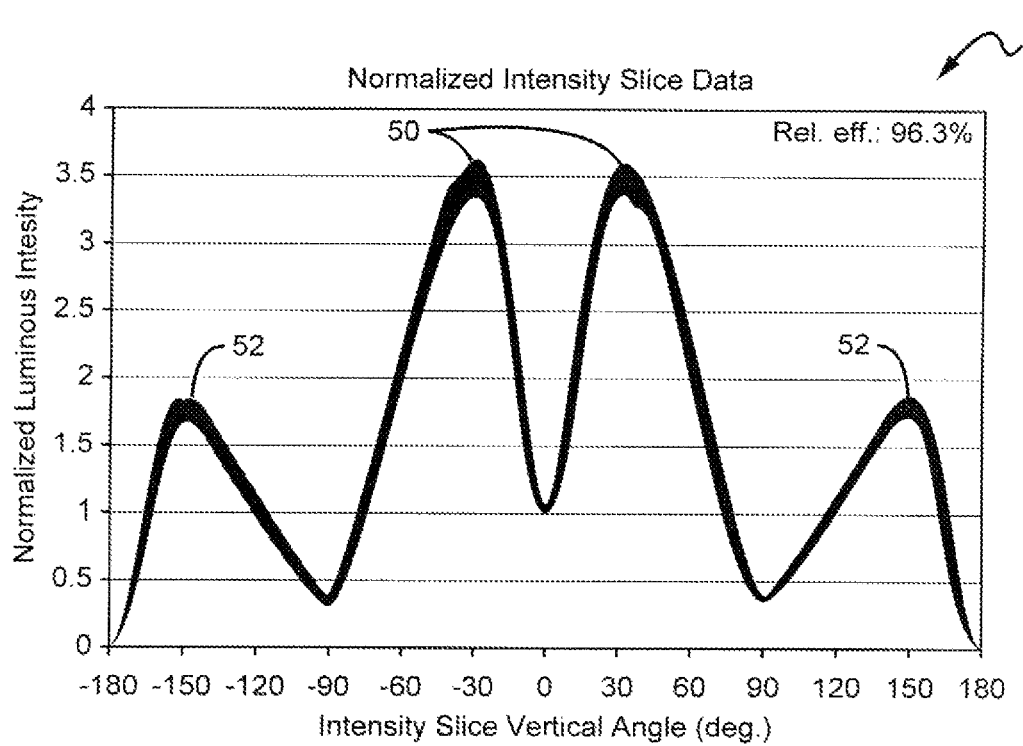
FIG. 9
FIG. 10
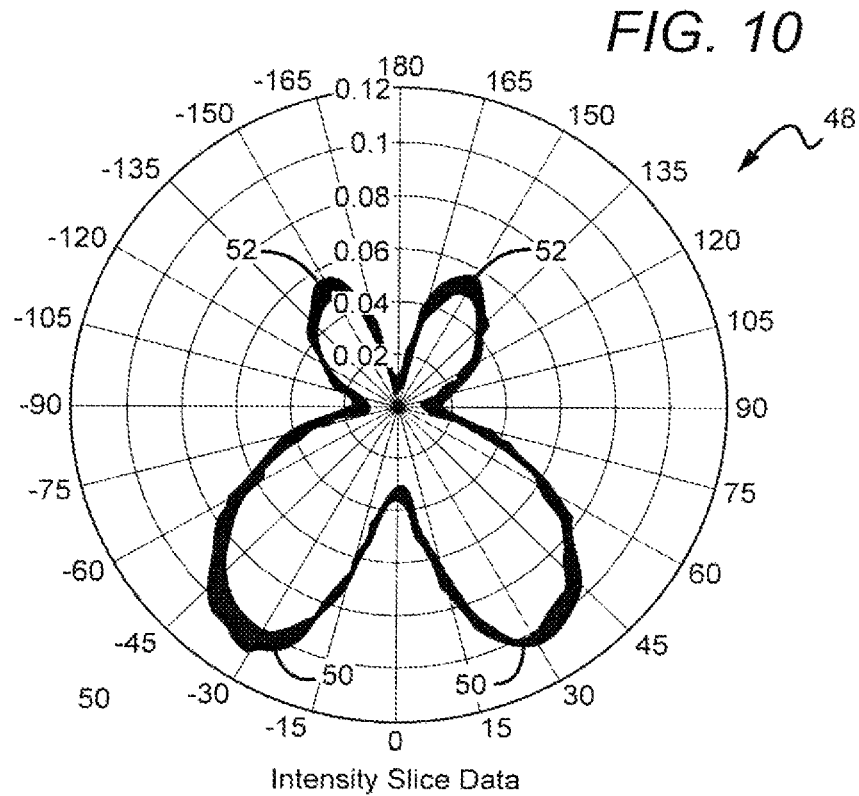

FIG. 18
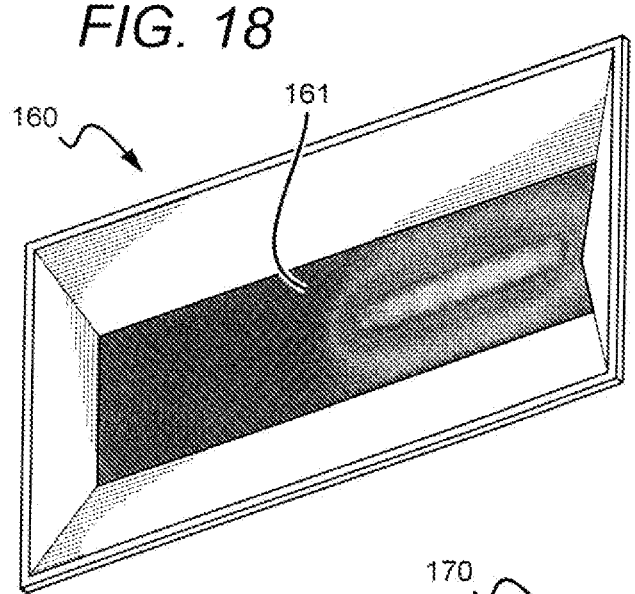
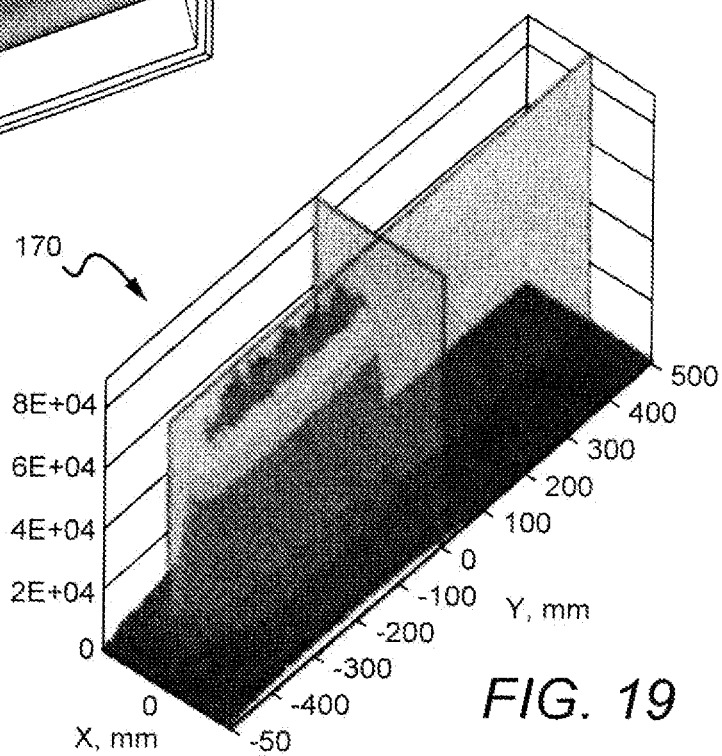
FIG. 19
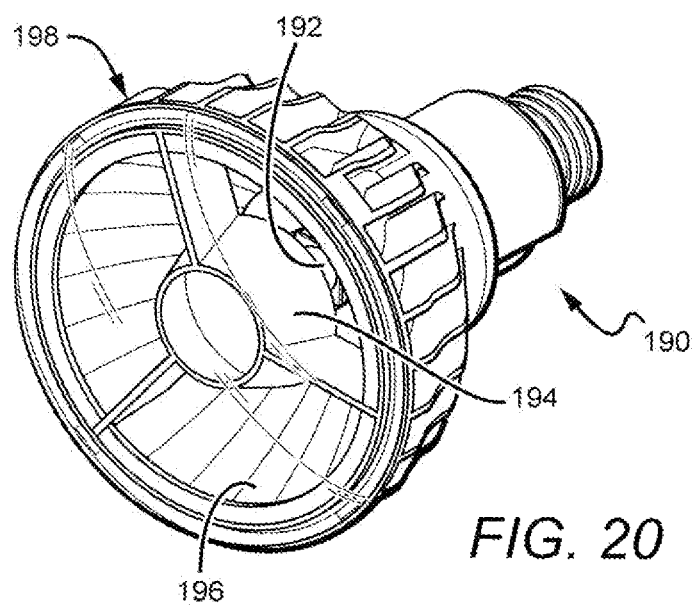
FIG. 20

LIGHT EMITTING DIODE PRIMARY OPTIC FOR BEAM SHAPING

BACKGROUND OF THE INVENTION

1. Field of the Invention

The invention relates to light emitting diodes (LED or LEDs) and LED components having primary optics for emission pattern shaping, and in particular for emission pattern broadening.

2. Description of the Related Art

Different LED light fixtures have been developed such as troffer-style fixtures that are used in commercial office and industrial spaces throughout the world. Previous troffers housed elongated fluorescent light bulbs that span the length of the troffer. Troffers may be mounted to or suspended from ceilings, such as being suspended by a "T-grid". Often the troffer may be recessed into the ceiling, with the back side of the troffer (i.e. troffer pan) protruding into the plenum area above the ceiling a distance of up to six inches or more. In other arrangements, elements of the troffer on the back side dissipate heat generated by the light source into the plenum where air can be circulated to facilitate the cooling mechanism. U.S. Pat. No. 5,823,663 to Bell, et al. and U.S. Pat. No. 6,210,025 to Schmidt, et al. are examples of typical troffer-style fixtures. These fixtures can require a significant amount of ceiling space to operate properly.

More recently, with the advent of the efficient solid state lighting sources, these troffers have been used with solid state light sources, such as light emitting diodes (LEDs). LEDs are solid state devices that convert electric energy to light and generally comprise one or more active regions of semiconductor material interposed between oppositely doped semiconductor layers. When a bias is applied across the doped layers, holes and electrons are injected into the active region where they recombine to generate light. Light is produced in the active region and emitted from surfaces of the LED.

LEDs have certain characteristics that make them desirable for many lighting applications that were previously the realm of incandescent or fluorescent lights. Incandescent lights are very energy-inefficient light sources with approximately ninety percent of the electricity they consume being released as heat rather than light. Fluorescent light bulbs are more energy efficient than incandescent light bulbs by a factor of about 10, but are still relatively inefficient. LEDs by contrast, can emit the same luminous flux as incandescent and fluorescent lights using a fraction of the energy.

In addition, LEDs can have a significantly longer operational lifetime. Incandescent light bulbs have relatively short lifetimes, with some having a lifetime in the range of about 750-1000 hours. Fluorescent bulbs can also have lifetimes longer than incandescent bulbs such as in the range of approximately 10,000-20,000 hours, but provide less desirable color emission. In comparison, LEDs can have lifetimes between 50,000 and 70,000 hours. The increased efficiency and extended lifetime of LEDs is attractive to many lighting suppliers and has resulted in LED light sources being used in place of conventional lighting in many different applications. It is predicted that further improvements will result in their general acceptance in more and more lighting applications. An increase in the adoption of LEDs in place of incandescent or fluorescent lighting would result in increased lighting efficiency and significant energy saving.

One design challenge associated with LED-based multi-source luminaires is blending the light from LED sources within the luminaire so as to provide a uniform illuminance and color uniformity across the light emitting surfaces of the luminaire. This is particularly true in the case of luminaires in which the LED sources are "forward facing"—i.e., oriented with the peak emission intensity directed towards the light emitting surfaces of the luminaire (in contrast to an "indirect" orientation in which the majority of light is reflected or scattered off of one or more surfaces prior to reaching the light emitting surface of the luminaire). FIGS. 1 and 2 show a conventional LED component 10 that can comprise many different commercially available LED components such as the XP family of LED components commercially available from Cree, Inc. The components can be used in current "forward facing" luminaire, with the component 10 generally comprising a submount or printed circuit board (PCB) 12, LED chip 14, and a primary optic or lens 16. In most conventional LED components, the primary optic is in a relatively simple shape such as hemispheric. These conventional components typically produce a Lambertian or cosine-like beam emission profiles as shown in graphs 18 and 20 FIGS. 3 and 4, respectively. These emission profiles are relatively narrow with a peak that can result in undesirable near-field intensity and color variations across the emitting surface of the luminaire.

FIG. 5 shows one embodiment of a troffer 22 having conventional LED components oriented in a "forward emitting" configuration, along with the simulated resulting illuminance pattern expected on the luminaire emission surface 24 (in order to simplify the simulation, the LED components occupy only approximately half of the luminaire). The Lambertian emission pattern of the LED components results in undesirable hot spots in intensity along the troffer's emission surface 24, with FIG. 6 being a graph 26 showing the relative peaks of the emission hot spots. Such a non-uniform luminance distribution is generally considered to be aesthetically undesirable for most lighting applications.

Accordingly, standard LED components with standard primary optics may not be compatible with forward facing or direct backlighting. Secondary optics have been developed for these components that can be used to shape the emission pattern to reduce the hot spots. Secondary optics, however, are formed separately from the LED components and are bonded to the LED component's primary optic. This approach results in additional manufacturing complexities and costs, and can also result in efficiency losses due to both absorption in the secondary optic and Fresnel loss associated with the additional optical interfaces presented by the secondary optic.

The emission surface of a direct or front-facing LED-based luminaire typically comprises a sheet of material which may incorporate scattering particles or surfaces or a surface texture to help mask or minimize luminance variations. However, in order to have a significant effect on the luminance distribution, it is generally necessary to provide a high degree of scattering—typically resulting in each light ray emitted by the LED component having multiple encounters with various internal surfaces of the luminaire. This approach can lead to a significant loss in efficiency since such scattering surfaces are not ideal and each scattering event thus leads to light loss.

Some recent designs have incorporated light sources or light engines utilizing an indirect lighting scheme in which the LEDs or other sources are aimed in a direction other than the intended emission direction. This may be done to encourage the light to interact with internal elements, such as scattering surfaces, for example. One example of an indirect fixture can be found in U.S. Pat. No. 7,722,220 to Van de Ven which is commonly assigned with the present application. As in the case of direct view luminaires with heavily diffusing elements, interaction with multiple scattering elements within the luminaire body can result in optical losses, with the losses increasing with the number of interactions.

SUMMARY OF THE INVENTION

The present invention is directed to LED components with primary optics providing improved emission characteristics. The present invention is also directed to light fixtures utilizing the LED components to provide improved light fixture emissions.

One embodiment of an LED component according to the present invention comprises an LED chip emitting an LED chip emission pattern. A primary optic is included directly on the LED chip with LED light from the LED chip passing through the primary optic. The primary optic shapes the LED emission pattern into an LED component emission pattern with the LED component emission pattern being broader than the LED chip emission pattern.

Another embodiment of an LED component according to the present invention comprises a submount with an LED chip on the submount. A primary optic is included directly on the LED chip with LED light from the LED chip passing through the primary optic. The primary optic is arranged to shape the LED light into a batwing-type emission pattern.

Still another embodiment of an LED component according to the present invention comprises a submount; and an LED chip mounted on the submount. A primary optic having a top concave portion is included directly on the LED chip with LED light from the LED chip passing through the primary optic. Different light fixture embodiments according to the present invention can also utilize a plurality of these LED components as their light source.

These and other aspects and advantages of the invention will become apparent from the following detailed description and the accompanying drawings which illustrate by way of example the features of the invention.

BRIEF DESCRIPTION OF THE DRAWINGS

FIG. 9 is a graph showing the emission characteristics of the LED component shown in FIG. 7;

FIG. 10 is another graph showing the emission characteristics of the LED component shown in FIG. 7;

FIG. 18 is a perspective view of one embodiment of an troffer-style light fixture utilizing LED components according to the present invention;

FIG. 19 is a graph showing the emission intensities at the emission surface of the troffer-style fixture in FIG. 18.

FIG. 20 is a perspective view on one light fixture that can utilize LED components according to the present invention;

DETAILED DESCRIPTION OF THE INVENTION

Figure 1:
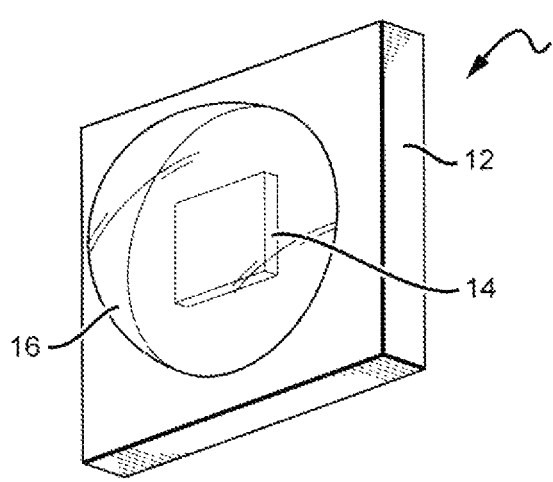
FIG. 1 is a perspective view of a conventional LED component.
Figure 2:
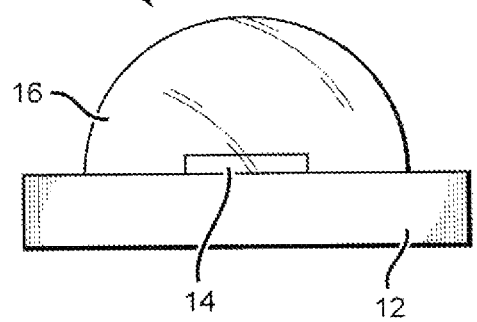
FIG. 2 is a side view of the LED component shown in FIG. 1.
Figure 3:
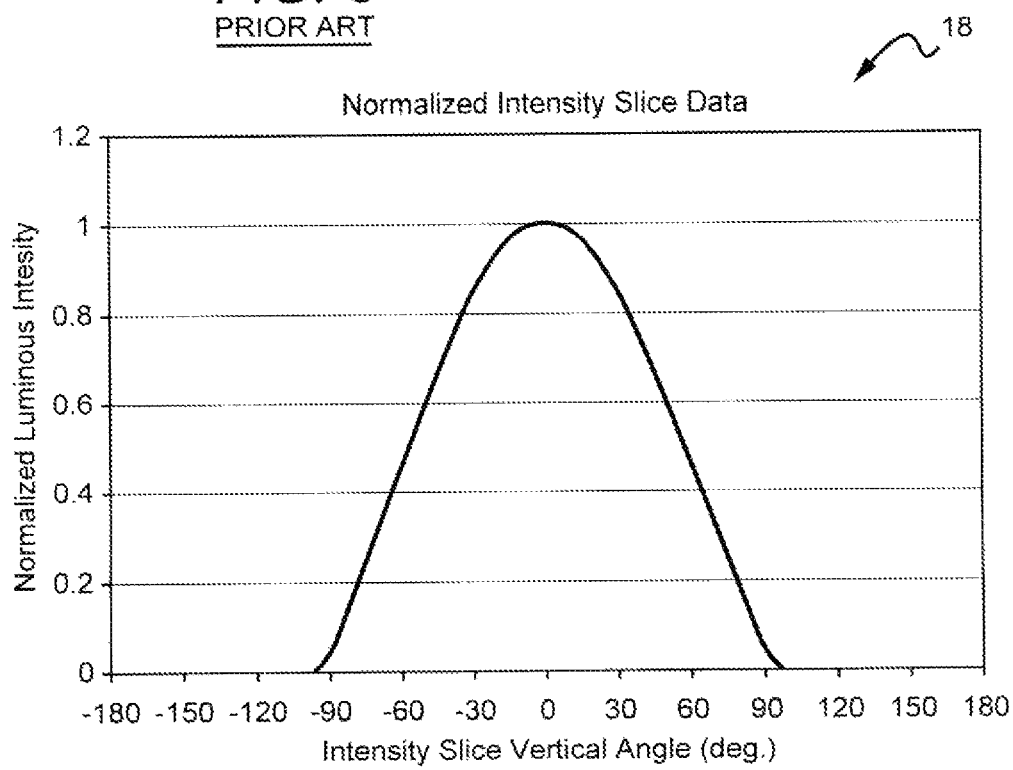
FIG. 3 is a graph showing the emission characteristics of the LED component shown in FIG. 1.
Figure 4:
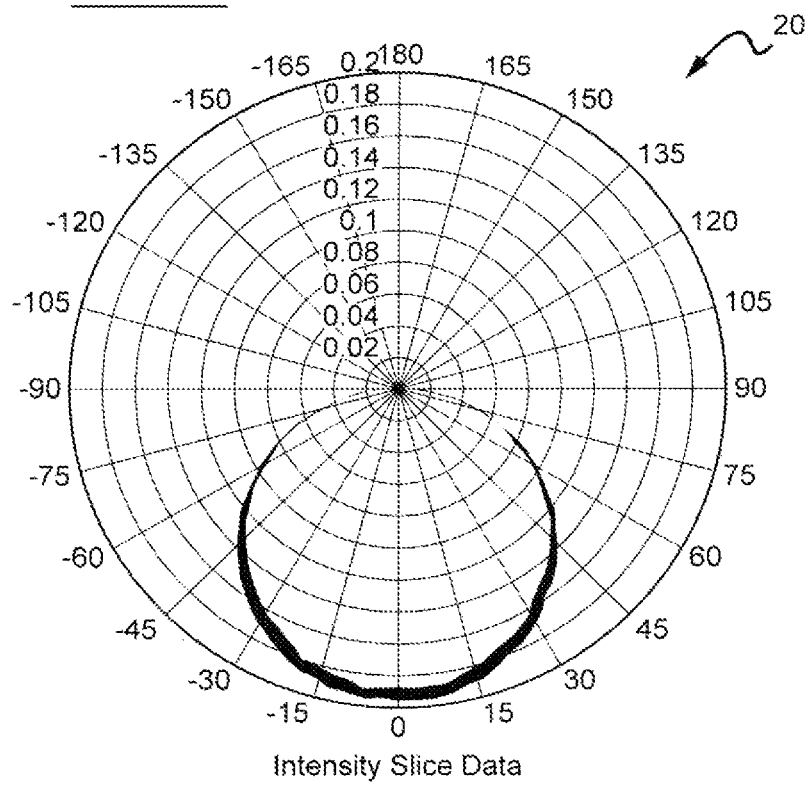
FIG. 4 is another graph showing the emission characteristics of the LED component shown in FIG. 1.

The present invention is generally directed to LED components having primary optics that make the LED components more compatible with direct emission light fixtures or luminaires, with one example being troffer-style light fixtures. The present invention utilizes custom primary optical elements as part of an LED package component which shapes the angular distribution of the light emitted by the package into a desired profile. Specifically, the different embodiments of the present invention can allow for the distribution of emitted light into angles typically not achieved with standard primary optical elements (which typically produce Lambertian or cosine-like beam profiles). Many applications such as backlighting and downlighting (e.g. troffers) benefit from the spreading or directing of the Lambertian LED beam profile into higher angles to reduce pixilation, or undesirable near-field intensity and color variations across the emitting surface of the backlight or troffer. This in turn can result in improved far field distribution. The present invention reduces or eliminates the need for secondary optical elements which can introduce efficiency loss and additional cost, while reducing overall lifetime and reliability. In cases where a secondary optical element is required, careful design of the primary optical element geometry can provide beneficial effects such as reducing the cost and/or complexity of the secondary optic, increasing the overall system efficiency, and enabling a wider variety of achievable optical beam profiles than would be otherwise possible using only a standard primary optic.

Different embodiments of the present invention provide a variety of geometrical shapes for the primary LED package optical element which differ significantly from standard hemispherical lens or flat lens encapsulation, thus providing custom light beam profile shaping. This beam shaping can be provided without the need for secondary optics, but it is understood that the LED packages according to the present invention can also be used with secondary optics. The geometries of the primary optical elements are arranged to allow for fabrication using conventional techniques such as injection molding, compression molding, or dispense, or may require more complex fabrication approaches.

The present invention can be used in many different lighting applications that would benefit from primary optic beam shaping and a more uniform light source, such as troffers, downlighting, backlighting, etc. Applications include the use of the present invention in luminaires such as troffers to allow for use with a reduced number of LED components (thereby reducing system cost) while avoiding pixilation (or non-uniform intensity and/or color variations) in the near field. Other potential applications include backlighting or any application in which it is desirable from an economic, efficiency and reliability standpoint to provide custom optical beam emission characteristics from LED components.

Some embodiments of the present invention are discussed with reference to direct emission light fixtures and light sources for direct emission light fixtures. Examples of direct light fixtures having a light source that at least partially utilizes LED components according to the present invention, and where at least some light from the LED components emits directly from the fixture's emission surface, are shown and described in U.S. patent application Ser. No. 12/418,796, to Pickard et al., entitled "Reflector System for Lighting Device," which is incorporated herein by reference.

It is understood that the present invention can also be directed to indirect light fixtures wherein light from the LED components can be reflected off one or more surfaces before emitting through the fixture's emission surface. Examples of indirect light fixtures having a light source that at least partially utilizes LED components according to the present invention are shown and described in U.S. patent application Ser. No. 12/418,796, to Pickard et al., entitled "Reflector System for Lighting Device," which is incorporated herein by reference. Other examples can comprise troffer-style indirect light fixtures as shown and described in U.S. patent application Ser. No. 12/873,303, to Edmond et al., entitled "Troffer-style Fixture," and U.S. patent application Ser. No. 13/429,080, to Edmond et al., entitled "Modular Indirect Troffer," both of which is incorporated herein by reference. The present invention can also be used with many different types of lighting fixtures and housings, but are particularly applicable to troffer-style fixture of different sizes such as those having a 2 foot by 4 foot troffer opening. The embodiments of the present invention can also be used in troffer-fixtures having a 1 foot by 4 foot, or 2 foot by 2 foot troffer opening.

It is further understood that LED components according to the present invention can also be used for backlighting of displays, such as LCD displays, with the LED components utilized for edge lighting or direct lighting for the displays. The LED components can also be used as the light source for LED lamps or LED bulbs, such as those described in U.S. patent application Ser. No. 13/028,946, to Long Larry Le et al., entitled "Solid State Lamp and Bulb," which is incorporated herein by reference The invention is described herein with reference to certain embodiments, but it is understood that the invention can be embodied in many different forms and should not be construed as limited to the embodiments set forth herein. In particular, the present invention is described below in regards to troffer-style light fixtures, but it is understood that it is applicable to many other lighting styles, types and applications. The embodiments are also described with reference to primary optics and LED chips, but it is understood that many different types and numbers of optics can be used that are arranged in many different ways. The fixtures can have LEDs or LED packages arranged in many different arrays having different shapes and different numbers of LEDs or LED packages. Many different commercially available LEDs can be used in the lighting fixtures according to the present invention such as those commercially available from Cree, Inc.

It is understood that when an element is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one element to another. It is understood that these terms are intended to encompass different orientations of the device in addition to the orientation depicted in the figures.

Although the terms primary, secondary, etc., may be used herein to describe various features, elements, components, regions and/or sections, these elements, components, regions, and/or sections should not be limited by these terms. These terms are only used to distinguish one element, component, region, or section from another. Thus, unless expressly stated otherwise, a primary feature, element, component, region, or section discussed below could be termed a secondary feature, element, component, region, or section without departing from the teachings of the present invention.

As used herein, the term light source or LED component can be used to indicate a single light emitter or more than one light emitter functioning as a single source. Thus, the term "source" or "LED component" should not be construed as a limitation indicating either a single-element or a multi-element configuration unless clearly stated otherwise. For example, the LED components or lighting fixtures described herein can comprise light sources having a single-element or multi-element configuration.

Embodiments of the invention are described herein with reference to view illustrations. The actual thickness, angles or orientations of the elements can be different, and variations from the shapes of the illustrations as a result, for example, of manufacturing techniques and/or tolerances are expected. Thus, the elements illustrated in the figures are schematic in nature and their shapes are not intended to illustrate the precise shape of a region of feature of an embodiment and are not intended to limit the scope of the invention.

Figure 7:
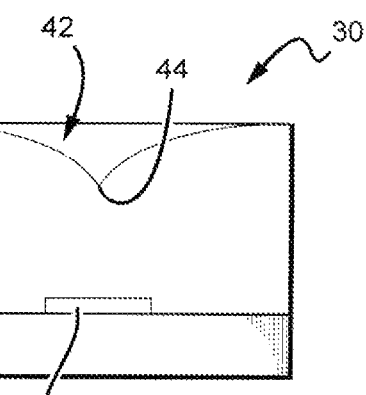
FIG. 7 is a side view of one embodiment of an LED component according to the present invention.
Figure 8:
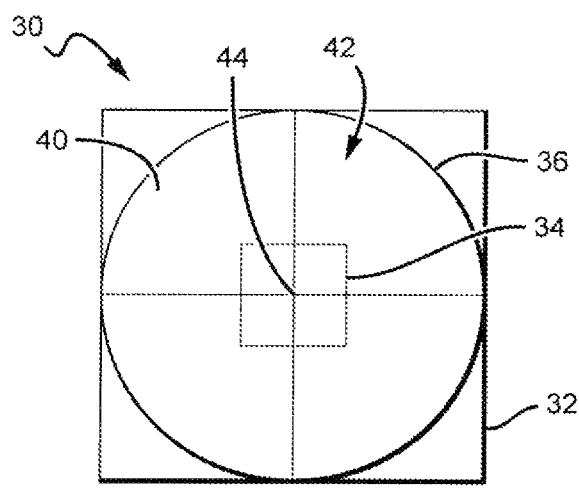
FIG. 8 is a top view of the LED component shown in FIG. 7.

FIGS. 7 and 8 show one embodiment of an LED component 30 according to the present that can be used in many different applications but is particularly applicable for use in backlighting, with the LED component arranged to reduce or eliminate hotspots that might be experienced utilizing conventional LED components. The LED component 30 comprises a submount 32, LED chip 34, and a primary optical element or lens 36. The LED component 30 further comprises electrically conductive elements, such as conductive traces and/or wire bonds (not shown), arranged so that an electrical signal applied to the LED component 30 causes the LED chip 34 to emit light. The LED component 30 is further arranged so that light from the LED chips emits through and out of the primary optic 36. The LED component 30 is shown with a single LED chip, but it is understood that other embodiments can have more than one LED chip. Some embodiments can comprise an LED array with a plurality of LED chips arranged in various serial or parallel interconnect combinations that cause the LEDs to emit light in response to an electrical signal. In some embodiments the LED chips in the arrays can emit the same color of light, while in other embodiments they can emit different colors of light that combine to produce the desired LED component emission. In some embodiments, one or more wavelength converting materials such as phosphors may be present within the vicinity of the LED chip or chips.

The primary optic 36 can have many different shapes and sizes and in the embodiment shown is shaped such that the light pattern emitting from the LED component is broader than the Lambertian type emission pattern provided by conventional LED components. That is, the emission pattern has higher intensities at greater viewing angles. In some embodiments, the primary optic can shape the LED chip emission pattern into a "batwing" type emission pattern. The term "batwing" refers to a light distribution whose luminous intensity is greater along a direction at a significant angle relative to the main axis of distribution rather than along a direction parallel to the main axis. The desirability of a batwing distribution is evident in many lighting applications, including in which most of the light should be distributed in a direction other than along the main axis. In some batwing distributions, multiple peak emissions can be provided that broaden the overall emission pattern.

In the embodiment shown, the primary optic 36 has a generally cylindrical or disk shape and can be arranged directly on the LED chip 34 and the submount 32 around the LED chip 34, although it is understood that in other embodiments intervening layers can be included. The LED chip 34 can be positioned at the base or bottom surface 38 of the cylindrical primary optic, approximately at the center of the base. The top surface 40 of the primary optic 36 can have different shapes to promote the spread of light emitting from the LED chip. In this embodiment the top surface 40 has a concave portion 42 that is generally conical shaped. The lowest with the lowest point 44 of the concave portion 42 can be approximately at the center of the top surface 40. Stated differently, the lowest point can be located approximately on the longitudinal axis of the primary optic 36. The surfaces of the concave portion 42 from the lowest point to the edge of the top surface 40 are curved.

The shape of the primary optic 36 results in an emission pattern with multiple emission peaks at different viewing angles, with the result being an overall broader emission pattern. FIGS. 9 and 10 show graphs 46 and 48 of the emission pattern that can be emitted by the LED component 30. Instead of one emission peak provided by a Lambertian emission pattern, the LED component 30 provides a "batwing" type emission pattern with primary emission peaks 50 at approximately 30° and −30° viewing angles, and smaller secondary emission peaks 52 at approximately 150° and −150° viewing angles. This can result in overall higher emission at greater viewing angles compared to a convention LED component.

The primary optics according to the present invention can be made of many different materials and can be formed using many different methods. The primary optic material may be any suitable encapsulating or optical material such as silicone or epoxy. The primary optic can be formed using different methods such as injection or compression molding. This type of process is relatively well developed and can provide flexibility in determining the shape of the primary optic with the shape being dependent on the shape of the mold. The primary optics can also be formed using conventional dispense methods, with the optic material dispensed over the LED chip and then cured. This dispense process can be completed with the LED component being flat (i.e. horizontal) or tilted to provide different types of optic shapes. For more complex shapes different methods can be used such as those described in U.S. patent application Ser. No. 13/306,589, to Tarsa et al., entitled "Complex Primary Optics and Methods of Fabrication," which is incorporated herein by reference.

It is understood that the primary optics can include many different features and can be arranged in many different ways. In some embodiments the top surface can have different concave or convex features, while in other embodiments shapes and features can also be included on the outer surface. In other embodiments the primary optics can include conversion materials on or within the primary optic to convert all or a portion of the LED chips light passing through the primary optic. In other embodiments dispersing materials can be included on or within the primary optic to disperse the LED light. Still in other embodiments, all or a portion of the surface of the primary optic can be roughened or textured to further disperse light passing through the optic. In still other embodiments, the LED chip may be intentionally offset with respect to the center axis of the primary optic. In still other embodiments, the primary optic may be asymmetric with respect to one or more axes of the LED component. In still other embodiments, the overall shape of the primary optic may be cylindrical or square or irregular or hemispherical or polygonal.

Figure 11:
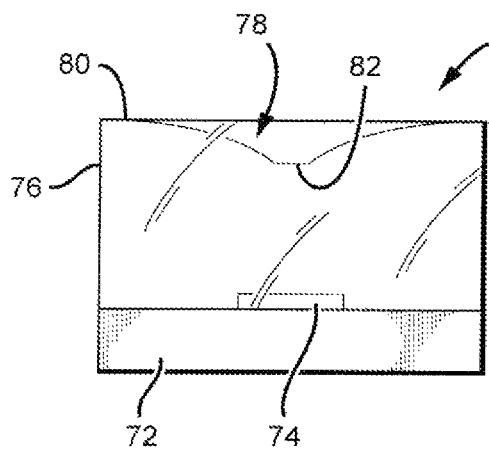
FIG. 11 is a side view of another embodiment of an LED component according to the present invention.

FIG. 11 shows another embodiment of an LED component 70 according to the present invention having a submount 72, and LED chip 74, and a primary optic 76. Like the embodiment described above and shown in FIGS. 7-9, the primary optic 76 has a generally cylindrical shape with a concave portion 78 in its top surface 80. The lowest point 82 of the concave portion 78 is near the center of the top surface (or along the primary optic's longitudinal axis), but does not come to a point. Instead, the lowest point 82 is a flat surface that can have many different shapes such as circular, oval, square, rectangular, etc. Like above, the side surfaces of the concave portion 78 are curved from the lowest point 82 to the edge of the top surface 80. This shape for the primary optic also provides a broader LED component emission pattern that in some embodiments can also comprise a batwing type emission pattern.

Figure 12:
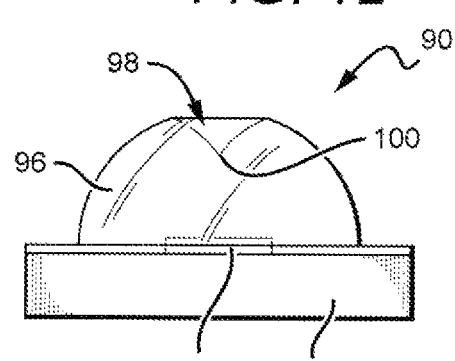
FIG. 12 is a side view of another embodiment of and LED component according to the present invention.

FIG. 12 shows another embodiment of an LED component 90 that can produce a broader, batwing type emission pattern, with the LED component 90 having a submount 92, LED chip 94, and primary optic 96 with a generally hemispheric shape. The top of the primary optic 96 also comprises a concave portion 98 having a lowest point 100 near the center (or on the longitudinal axis of) of the primary optic 96, and has curved surfaces to the edge of the concave portion. This shape also results in a broader emission pattern compared to conventional LED components.

Figure 13:
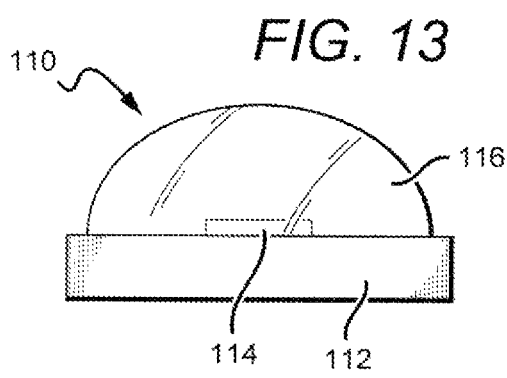
FIG. 13 is a side view of another embodiment of an LED component according to the present invention.

It is understood different shapes of the primary optic can produce a broadened LED component emission pattern and that not all primary optic embodiments have a concave portion. FIG. 13 shows still another embodiment of an LED component 110 according to the present invention comprising a submount 112, LED chip 114, and a primary optic 116. In this embodiment the primary optic 116 is generally hemispheric, but does not comprise a concave portion. Instead, the lens is not symmetrical (i.e. does not have a uniform radius), but instead has a "slumped" hemispheric shape. That is, the radius of the primary optic 116 is smaller directly above the LED chip 114 (i.e. along the optics primary optic), and increases at greater viewing angles. Although this shape may not produce a batwing-type emission pattern, it can produce a broadened Lambertian type pattern.

Figure 14:
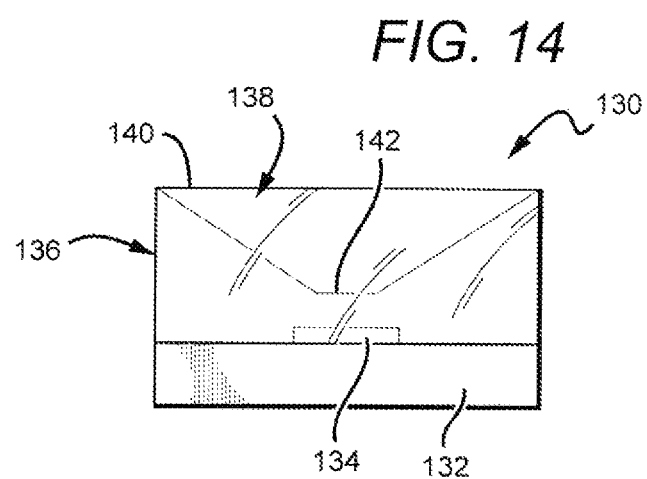
FIG. 14 is side view of still another embodiment of an LED component according to the present invention.
Figure 15:
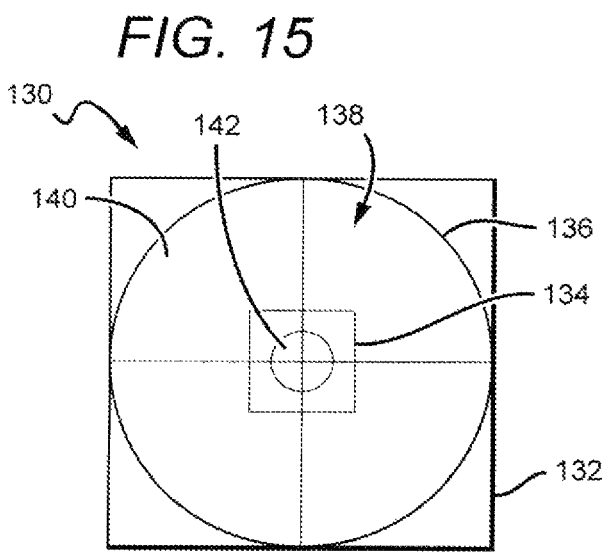
FIG. 15 is a side view of the LED component shown in FIG. 14.

FIGS. 14 and 15 show still another embodiment LED component 130 according to the present invention, comprising a submount 132, LED chip 134 and primary optic 136. The primary optic 136 further comprises a concave portion 138 in its top surface 140. The lowest point 142 of the concave portion 138 can extend further into the primary optic 136, and in the embodiment shown can extend to a point greater than half way down into the primary optic 136. The lowest point 142 can also have a flat surface, and the side surfaces of the concave portion can be planar (i.e. not curved) from the lowest point 142 to the edge of the top surface 140.

Figure 16:
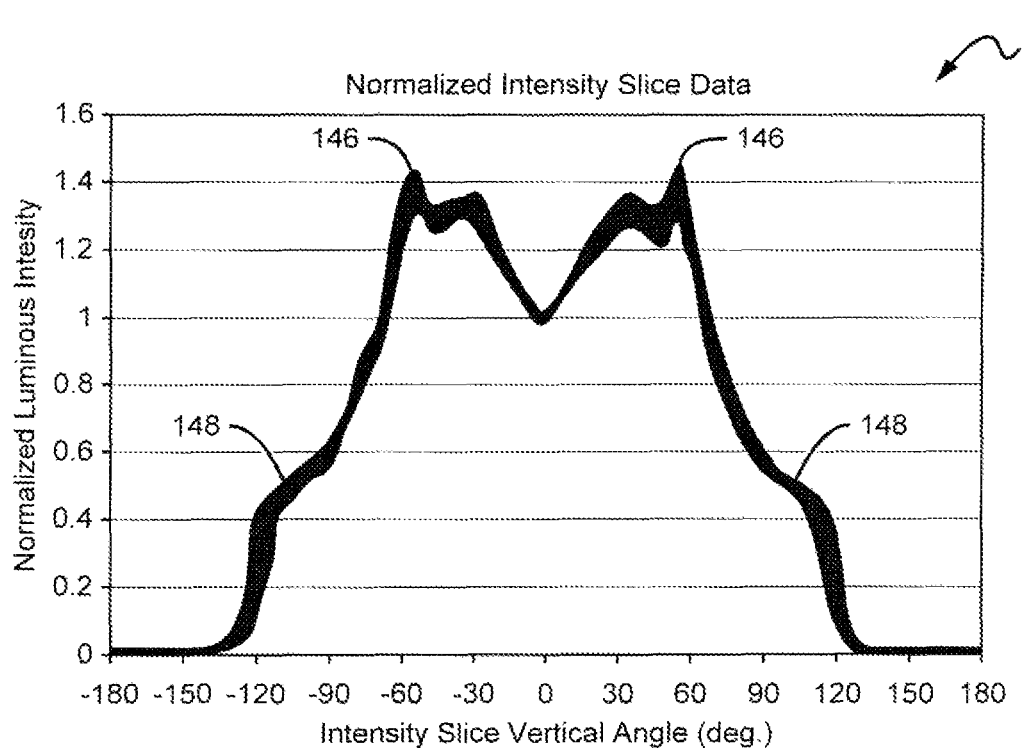
FIG. 16 is a graph showing the emission characteristics for the LED component shown in FIG. 14
Figure 17:
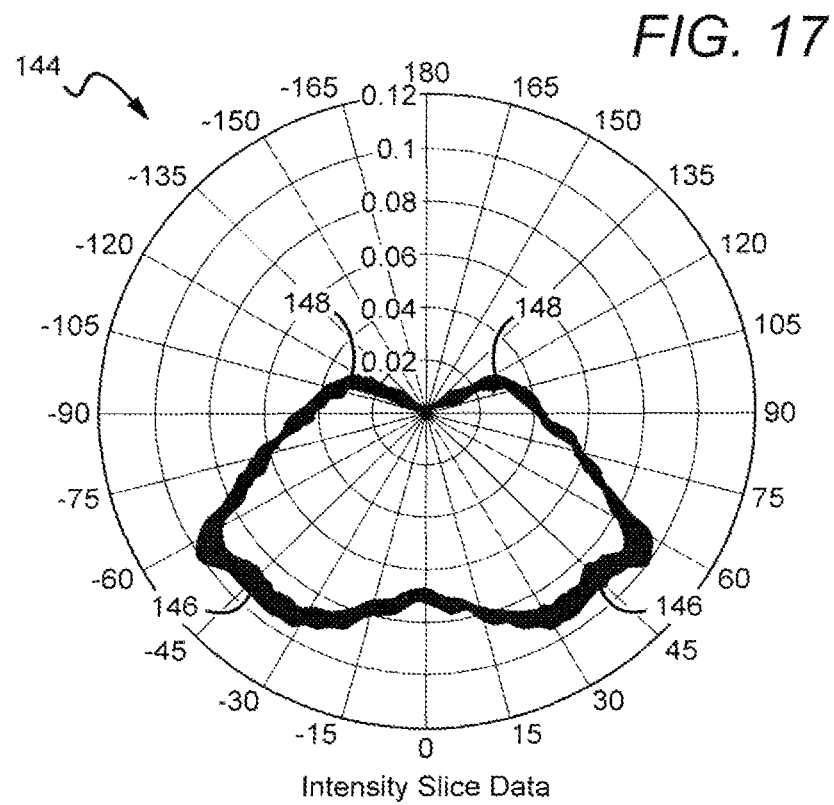
FIG. 17 is a second graph showing the emission characteristics of the LED component shown in FIG. 14.

FIGS. 16 and 17 show graphs 143, 144 showing the emission pattern that can be produced by the LED component 130. The emission pattern comprises two relatively broad primary peaks 146, with the first being at an approximate 30 to 40° viewing angle, and the second at an approximate −30 to −40° viewing angle. The emission pattern also comprises secondary lobes 148 at approximately 120° and −120° viewing angles to further broaden the emission pattern of the LED component 130.

Figure 5:
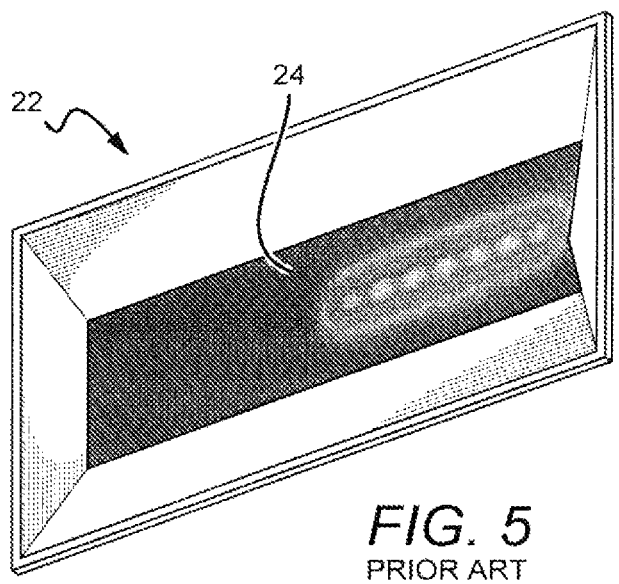
FIG. 5 is a perspective view of troffer-style light fixture utilizing conventional LED components.
Figure 6:
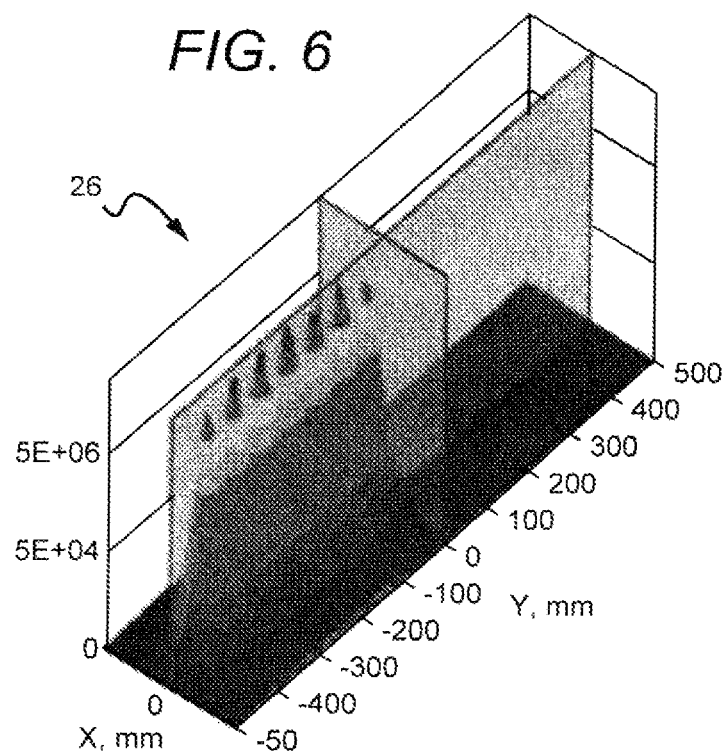
FIG. 6 is graph showing the emission intensities on the emission surface of the troffer-style light fixture shown in FIG. 5.

FIG. 18 shows one embodiment of a troffer 160 utilizing LED components according to the present invention, with the embodiment shown having a linear array of LED components to illuminate approximately half of the troffer's emission surface 162. FIG. 19 is a graph 170 showing the emission intensities along the half of the troffer's emission surface. The emission patterns of the LED components can at least partially overlap. Compared to the emission provided by conventional LED components (as shown in FIGS. 5 and 6 and described above), the emission provided by LED components according to the present invention provide reduced intensity hot spots along the troffer's emission surface 162.

It is understood that embodiments presented herein are meant to be exemplary. Embodiments of the present invention can comprise any combination of compatible features shown in the various figures, and these embodiments should not be limited to those expressly illustrated and discussed.

As discussed above, the light fixtures can utilize LED components according to the present invention for direct light emission, where at least some of the light from the LED components emits directly out the fixture's emission surface. Other light fixtures can use LED components as their light source in indirect light emission where light from the LED components is reflected off one or more surfaces before emitting from the fixture's emission surface.

Figure 21:
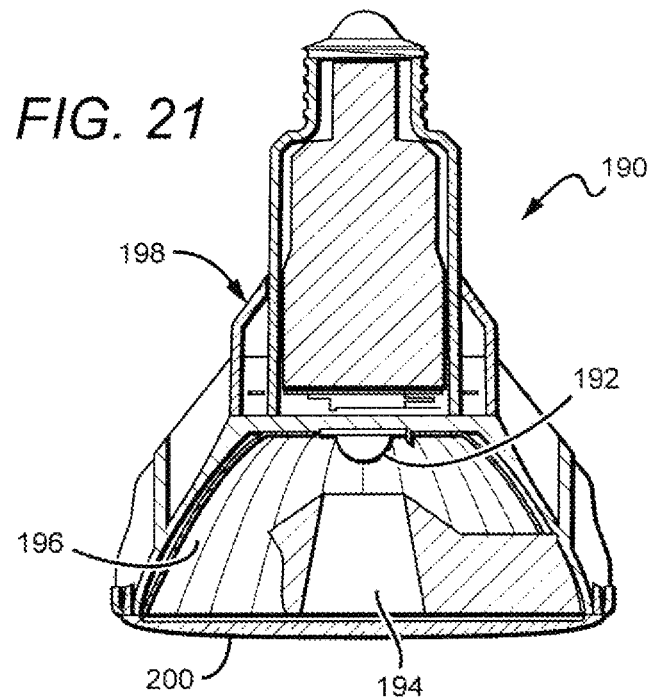
FIG. 21 is a sectional view of the fixture shown in FIG. 20.

FIGS. 20 and 21 show one embodiment of an LED fixture 190 that can utilize LED components according to the present invention, and where at least some of the light from the LED components emits directly from the LED component through the fixture emission surface. A light source 192 is disposed at the base of a bowl-shaped region within the lamp 190, with the light source being one of the LED components according to the present invention. In some embodiments, the light source can also utilize more than one LED component as its light source. In some embodiments, an intermediate reflector 194 is disposed proximate to the light source 192. Some of the light emitted from the source 192 can interact with the intermediate reflector 194 such that it is redirected toward an outer reflector 196. The outer reflector 196 and the intermediate reflector 194 can work in concert to shape the light into a beam having characteristics that are desirable for a given application. A protective housing 198 surrounds the light source 192 and the reflectors 194, 196. The source 192 is in good thermal contact with the housing 198 at the base of the outer reflector 196 to provide a pathway for heat to escape into the ambient. A lens 200 covers the open end of the housing 198 to provide protection from outside elements, with the lens being the fixture's primary emission surface.

Figure 22:
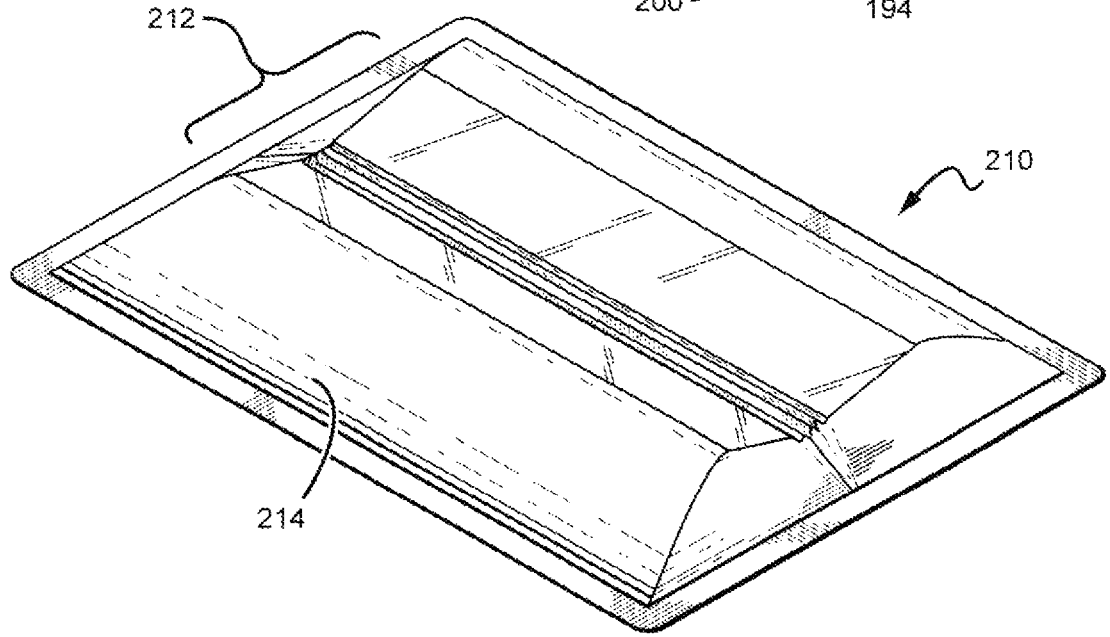
FIG. 22 is a perspective view on another light fixture that can utilize LED components according to the present invention.
Figure 23:
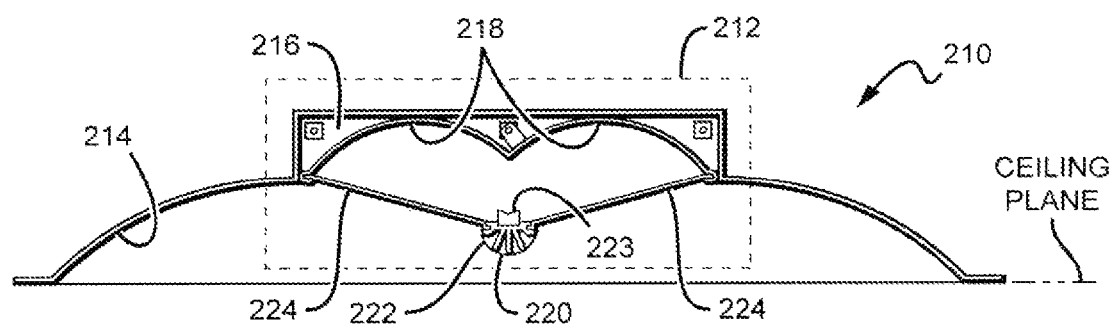
FIG. 23 is a sectional view of the fixture shown in FIG. 22.

FIGS. 22 and 23 show another embodiment and LED fixture 210 according to the present invention having a light source comprising one or more LED components according to the present invention and wherein light from the LED components emits from the LED fixture after reflecting off one or more surfaces of the fixture. The light fixture 210 comprises a troffer having a light engine unit 212 which fits within a reflective pan 214 that surrounds the perimeter of the light engine 212. The troffer 210 may be suspended or fit-mounted within a ceiling. The view of the troffer 210 in FIG. 21 is from an area underneath the troffer 210, i.e., the area that would be lit by the light sources housed within the troffer 210. FIG. 22 is a cross-sectional view of the troffer 210. As shown, the light engine 212 is mounted to fit within the pan 214. The light engine 212 comprises a body 216 that is shaped to define an interior surface comprising a back reflector 218. A heat sink 220 is mounted proximate to the back reflector 218. The heat sink 220 comprises a mount surface 222 that faces toward the back reflector 218. The mount surface 222 provides a substantially flat area where light sources 223 can be mounted to face toward the center region of the back reflector 218, although the light sources could be angled to face other portions of the back reflector 218. The light source can comprise one or more LED components according to the present invention. In this embodiment, lens plates 224 extend from both sides of the heat sink 220 to the bottom edge of the body 216. Light from the light source reflects off the reflector and emits from through the lens plates in the desired emission pattern.

Although the present invention has been described in detail with reference to certain preferred configurations thereof, other versions are possible. Therefore, the spirit and scope of the invention should not be limited to the versions described above.

We claim:

1. A light emitting diode (LED) component, comprising:
an LED chip emitting an LED chip emission pattern; and
a primary optic directly on said LED chip with LED light from said LED chip passing through said primary optic, said primary optic shaping said LED emission pattern into an LED component emission pattern, said LED component emission pattern being broader than the LED chip emission pattern.

2. The LED component of claim 1, wherein said LED chip emission pattern is a Lambertian type pattern.

3. The LED component of claim 1, wherein said LED component emission pattern is a batwing emission pattern.

4. The LED component of claim 1, wherein said LED component emission pattern comprises two peak emissions.

5. The LED component of claim 4, wherein said LED component emission pattern further comprises two secondary peak emissions.

6. The LED component of claim 1, wherein said primary optic comprises a cylindrical shape.

7. The LED component of claim 1, wherein said primary optic comprises a concave portion.

8. The LED component of claim 1, wherein said primary optic comprises a top concave portion.

9. The LED component of claim 1, wherein said primary optic comprises a conical shaped top concave portion.

10. The LED component of claim 1, wherein said primary optic is hemispheric shaped and comprises a top concave portion.

11. The LED component of claim 1, wherein said primary optic comprises a slumped hemispheric shape.

12. A light emitting diode (LED) component, comprising:
a submount;
an LED chip on said submount; and
a primary optic directly on said LED chip with LED light from said LED chip passing through said primary optic, said primary optic shaping said LED light into a batwing-type emission pattern.

13. The LED component of claim 12, wherein said batwing type emission pattern comprises two peak emissions.

14. The LED component of claim 13, wherein said batwing type emission pattern further comprises two secondary peak emissions.

15. The LED component of claim 12, wherein said primary optic comprises a cylindrical shape.

16. The LED component of claim 12, wherein said primary optic comprises a concave portion.

17. The LED component of claim 12, wherein said primary optic comprises a top concave portion.

18. The LED component of claim 12, wherein said primary optic comprises a conical shaped top concave portion.

19. The LED component of claim 12, wherein said primary optic is hemispheric shaped and comprises a top concave portion.

20. The LED component of claim 12, wherein said primary optic comprises a slumped hemispheric shape.

21. A light emitting diode (LED) component, comprising:
a submount;
an LED chip on said submount; and
a primary optic directly on said LED chip with LED light from said LED chip passing through said primary optic, said primary optic comprising a top concave portion.

22. The LED component of claim 21, wherein said LED light emits in an LED chip emission pattern wherein said primary optic shapes said LED emission pattern into an LED component emission pattern, said LED component emission pattern being broader than the LED chip emission pattern.

23. The LED component of claim 22, wherein said LED chip emission pattern is a Lambertian type pattern.

24. The LED component of claim 22, wherein said LED component emission pattern is a batwing emission pattern.

25. The LED component of claim 22, wherein said LED component emission pattern comprises two peak emissions.

26. The LED component of claim 22, wherein said LED component emission pattern further comprises two secondary peak emissions.

27. The LED component of claim 21, wherein said primary optic comprises a cylindrical shape.

28. The LED component of claim 21, wherein said top concave portion is conical shaped.

29. The LED component of claim 21, wherein said primary optic is hemispheric shaped and comprises a top concave portion.

30. The LED component of claim 21, wherein said primary optic comprises a slumped hemispheric shape.

31. The LED component of claim 21, wherein said LED chip is in electrical contact with said submount.

32. A light fixture, comprising:
a plurality of light emitting diode (LED) components at least some of which comprise:
an LED chip emitting an LED chip emission pattern; and
a primary optic directly on said LED chip with LED light from said LED chip passing through said primary optic, said primary optic shaping said LED emission pattern so that emission pattern of said LED component is broader than the LED chip emission pattern.

33. The light fixture of claim 32, further comprising an emission surface, wherein said LED components emit directly on said emission surface.

34. The light fixture claim 32, comprising a troffer-style light fixture.

35. The LED component of claim 32, wherein said LED chip emission pattern is a Lambertian type pattern and said LED component emission pattern is a batwing emission pattern.

36. The LED component of claim 32, wherein said LED component emission pattern comprises two peak emissions.

37. The LED component of claim 36, wherein said LED component emission pattern further comprises two secondary peak emissions.

38. The LED component of claim 32, wherein said primary optic comprises a cylindrical shape a concave portion.

39. The LED component of claim 38, wherein said concave portion has comprises a conical shape.

40. The LED component of claim 32, wherein said primary optic is hemispheric shaped and comprises a top concave portion.

41. The LED component of claim 32, wherein said primary optic comprises a slumped hemispheric shape.

42. The light fixture of claim 32, further comprising an emission surface, wherein said LED components emit indirectly on said emission surface.

43. The light fixture claim 42, comprising a troffer-style light fixture.

44. The light fixture of claim 32, comprising a display.

45. The light fixture of claim 32, comprising an LED bulb.

* * * * *